United States Patent [19]

Sato et al.

[11] Patent Number: 4,839,400
[45] Date of Patent: Jun. 13, 1989

[54] ACTIVE ENERGY RAY-CURABLE RESIN COMPOSITION

[75] Inventors: Yasufumi Sato; Megumi Munakata; Hiromichi Noguchi, all of Atsugi, Japan

[73] Assignee: Canon Kabushiki Kaisha, Tokyo, Japan

[21] Appl. No.: 22,930

[22] Filed: Mar. 6, 1987

[30] Foreign Application Priority Data

Mar. 10, 1986 [JP] Japan .................. 61-050560

[51] Int. Cl.⁴ .......................................... C08F 265/06
[52] U.S. Cl. ........................................ 522/14; 522/33;
522/36; 522/43; 522/46; 522/48; 522/59;
522/63; 522/68; 522/77; 522/92; 522/95;
522/102; 522/106; 522/121; 525/279; 525/289
[58] Field of Search .......... 525/289, 290, 910, 913,
525/279; 522/92, 102, 14, 36, 43, 46, 48, 63, 33,
69, 68, 77, 121, 106, 95; 156/273.3; 346/140 R

[56] References Cited

U.S. PATENT DOCUMENTS

| | | | |
|---|---|---|---|
| 3,655,826 | 4/1972 | Fellmann | 525/289 |
| 4,533,975 | 8/1985 | Bill | 522/92 |
| 4,688,054 | 8/1987 | Inamoto | 346/140 |

*Primary Examiner*—John C. Bleutge
*Assistant Examiner*—David Buttner
*Attorney, Agent, or Firm*—Fitzpatrick, Cella, Harper & Scinto

[57] ABSTRACT

An active energy ray-curable resin composition comprises (A) a graft copolymerized polymer comprising graft chains composed mainly of structural units derived from at least one monomer selected from the group consisting of (a) hydroxyl containing (meth)acrylic monomers, (b) amino or alkylamino containing (meth)acrylic monomers, (c) carboxyl containing (meth)acrylic or vinyl monomers, (d) N-vinylpyrrolidone, (e) vinylpyridine or its derivatives and (f) (meth)acrylic amide derivatives represented by the general formula (II) shown below:

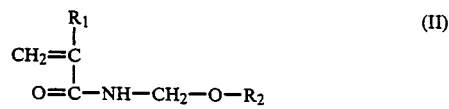

(wherein $R_1$ is hydrogen or methyl group and $R_2$ is hydrogen or an alkyl or acyl group having 1 to 4 carbon atoms which may have hydroxyl group added to trunk chains composed mainly of structural units compsiting at least one monomer selected from the group consisting of the monomer represented by the general formula (I) shown below:

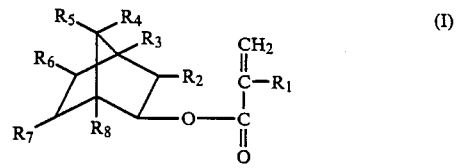

(wherein $R_1$ to $R_8$ each represent hydrogen or methyl group), alkyl (meth)acrylates, acrylonitrile and styrene, and (B) a monomer having an ethylenically unsaturated bond.

22 Claims, No Drawings

ACTIVE ENERGY RAY-CURABLE RESIN COMPOSITION

BACKGROUND OF THE INVENTION

1. Field of the Invention

This invention relates to a resin composition which can be cured by irradiation of an active energy ray such as UV-ray, electron beam, etc., particularly to an active energy ray-curable type resin composition which is excellent in adhesion to a substrate such as glass, ceramics, plastic films, etc., chemical resistance, heat resistance and mechanical strength and is capable of forming a pattern thereon. The active energy ray-curable resin composition is a resin composition which can be formed into a solid photosensitive sheet (dry film).

2. Related Background Art

In recent years, active energy ray-curable resin compositions have been frequently used as coating materials, inks, sealing materials, resist materials, pattern forming material. The active energy-ray curable resin compositions as the pattern forming material have been used for preparation of printing plates at the initial stage, but they have been recently utilized also for construction materials of elements such as fluid logical elements, in addition to utilization in the field of electronic industries such as print wirings, integrated circuits, etc.

However, among the active energy ray-curable resin compositions used for pattern formation heretofore known, particularly among those of dry film type, there has been no resin excellent in adhesion to a substrate such as glass, ceramics or plastic films, etc. On the other hand, those which are known as photocurable type coating materials or adhesives to be used for glass, metals, ceramics, etc. are excellent in adhesion of the cured product, but irradiation of a strong active energy ray or prolonged time of irradiation is required, and yet they have not generally suitable properties for pattern formation. Thus, even if it is attempted to obtain a pattern by irradiating an active energy ray in a pattern by use of these materials and removing the non-exposed portion by development, it was impossible to obtain a pattern of high precision and high resolution.

As described above, in the prior art, there has been no material which is capable of forming a precise pattern with excellent adhesion on various substrates, and which pattern has also high durability as the construction material.

SUMMARY OF THE INVENTION

An object of the present invention is to provide an active energy ray-curable resin composition capable of forming a pattern which is excellent in adhesion to a support, chemical resistance, heat resistance and mechanical strength, precise and of high resolving power, and which could not be accomplished by such an active energy ray-curable resin composition of the prior art as described above.

According to the present invention, there is provided an active energy ray-curable resin composition comprising: (A) a graft copolymerized polymer comprising graft chains composed mainly of structural units derived from at least one monomer selected from the group consisting of (a) hydroxyl containing (meth)acrylic monomers, (b) amino or alkylamino containing (meth)acrylic monomers (c) carboxyl containing (meth)acrylic or vinyl monomers, (d) N-vinylpyrrolidone, (e) vinylpyridine or its derivatives and (f) (meth)acrylic amide derivatives represented by the general formula (II) shown below:

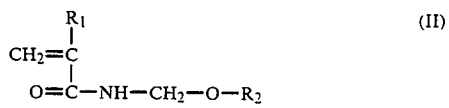

(wherein $R_1$ is hydrogen or methyl group and $R_2$ is hydrogen or an alkyl or acyl group having 1 to 4 carbon atoms which may have hydroxyl group) added to trunk chains composed mainly of structural units comprising at least one monomer selected from the group consisting of the monomer represented by the general formula (I) shown below:

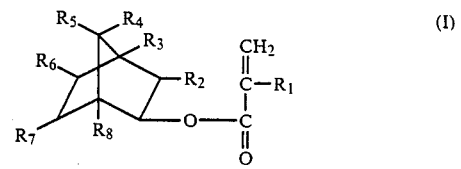

(wherein $R_1$ to $R_8$ each represent hydrogen or methyl group), alkyl (meth)acrylates, acrylonitrile and styrene, and (B) a monomer having an ethylenically unsaturated bond.

Description of the preferred embodiments

In the following, the present invention is described in more detail. Throughout the specification, "(meth)acryloyl group", "(meth)acrylate" and "(meth)acryl" are inclusive of "acryloyl group and methacryloyl group", "acrylate and methacrylate", and "acryl and methacryl", respectively.

The graft copolymerized copolymer (A) which is the essential component of the active energy ray-curable resin composition of the present invention comprises graft chain composed mainly of the above monomers (a) to (f) having hydrophilic property which can exhibit excellent adhesiveness to a support grafted onto the trunk chain adapted for a structural material which is relatively rigid and excellent in heat resistance.

The (meth)acrylate derivative represented by the general formula (I) which is the essential component constituting the trunk chain of the above graft copolymer has the specific features of a very high glass transition point and low hygroscopicity, and imparts high heat resistance and durability to the composition of the present invention.

The proportion of the (meth)acrylate derivative represented by the formula (I) to be formulated may be preferably 1 to 60 wt. % of the whole monomers, particularly preferably within the range of from 1 to 30 wt. % when used as a dry film.

Another monomer constituting the trunk chain of the graft copolymer is an alkyl (meth)acrylate having 1 to 4 carbon atoms in the alkyl group such as methyl (meth)acrylate, ethyl (meth)acrylate, isobutyl (meth)acrylate, t-butyl (meth)acrylate, and the like, acrylonitrile and styrene.

The trunk chain may also be, in addition to those derived only from the above monomers, a trunk chain comprising, for example, methyl (meth)acrylate, ethyl (meth)acrylate, n-butyl (meth)acrylate, lauryl (meth)acrylate, 2-ethylhexyl (meth)acrylate, glycidyl (meth)

acrylate, vinyl acetate, etc., added to the above monomers as the component for copolymerization at a proportion within the range of from 0 to about 50 wt. %. The above trunk chain in the composition of the present invention gives high coagulating strength and heat resistance to the composition.

To show specific examples of the monomers constituting the graft chains of the graft copolymer in the present invention, as the hydroxyl containing (meth)acrylic monomer (a), there may be included 2-hydroxyethyl (meth)acrylate, 2-hydroxypropyl (meth)acrylate, 3-chloro-2-hydroxyproplyl (meth)acrylate, 4-hydroxybutyl (meth)acrylate, 3-hydroxy-butyl (meth)acrylate, 5-hydroxypentyl (meth)acrylate, 6-hydroxyhexyl (meth)acrylate; a monoester of 1,4-cyclohexanedimethanol and acrylic or methacrylic acid; a product known under a trade name of Aronix M5700 produced by Toa Gosei Kagaku Co., Ltd.; caprolactone acrylate known under a trade name of TONE M100 produced by Union Carbide Co.; a product known under a trade name of Light Ester HO-mpp produced by Kyoei Yushi Kagaku Co., Ltd.; 2-hydroxy-3-phenoxypropyl acrylate known under a trade name of Light Ester M-600A produced by Kyoei Yushi Kagaku Co., Ltd.; and monoesters of (meth)acrylic acid and dihydric alcohols such as 1,10-decandiol, neopentylglycol, bis-(2-hydroxyethyl)terephthalate, addition products of bis-phenol-A and ethylene oxide or propylene oxide, etc.

Examples of the amino- or alkylamino-group containing acrylic monomer (b) are (meth)acryl amide, N,N-dimethylaminoethyl-(meth)acryl amide, N,N-dimethyl-(meth) acryl amide, N,N-dimethylaminopropyl-(meth)acryl amide, and N,N-di-t-butylaminoethyl-(meth)acryl amide.

Examples of the carboxyl group containing (meth) acrylic or vinyl monomer (c) are (meth)acrylic acid, fumaric acid, itaconic acid, and products known under a trade name of Aronix M-5400 or Aronix-M-5500 produced by Toa Gosei Kagaku Co., Ltd. (d) N-vinylpyrrolidone.

Examples of the vinyl pyridine or derivative thereof (e) are 2-vinylpyridine, 4-vinylpyridine, 2-vinyl-6-methylpyridine, 4-vinyl-1-methylpyridine, 2-vinyl-5-ethylpyridine and 4-(4-piperidinoethyl)-pyridine.

The above-mentioned monomers (a)–(d) and (e) are all hydrophilic and provide the composition of the present invention with a strong adhesion to a substrate such as glass, ceramics, plastics etc.

As the (meth)acrylic amide derivative (f) represented by the formula (II) or (f), there may be included monomers which are hydrophilic and have heat crosslinkability such as N-methylol(meth)acrylamide,
N-porpoxymethyl(meth)acrylamide,
N-n-butoxymethyl(meth)acrylamide,
$\beta$-hydroxyethoxymethyl(meth)acrylamide,
N-ethoxymethyl(meth)acrylamide,
N-methoxymethyl(meth)acrylamide, etc.

These monomers (f) have hydrophilic property as a matter of course and also condensing crosslinkability by heating, and water molecules or alcohols are eliminated generally at a temperature of 100° C. or higher to form crosslinks, thereby forming a network structure after curing in the graft copolymer itself, whereby the pattern obtained by curing is further improved in chemical resistance and mechanical strength to make the present invention more effective.

Also, by constituting the graft chains by adding partially a monomer which is subjected to ring opening by heat to be crosslinked, for example, glycidyl (meth)acrylate, etc., to the above monomers (a) to (f), the same effect as in the above (f) can be obtained.

Other than the thermal crosslinking as described above, it is also effective to introduce a photopolymerizable monomer as a part of the graft chains of the graft copolymerized polymer in the present invention for the same purpose and crosslink the graft copolymer with an active energy ray.

As such methods for imparting photopolymerizability to the graft chains, there may be employed, for example, ⓐ the method in which a carboxyl containing monomer exemplified by (meth)acrylic acid, etc., or an amino or tertiary amino containing monomer is copolymerized, followed by the reaction with glycidyl(meth)acrylate, etc.;

ⓑ the method in which a compound having one isocyanate group and one or more (meth)acrylic ester groups in one molecule is reacted with the hydroxyl group, amino group or carboxyl group in the graft chain;

ⓒ the method in which (meth)acrylic acid chloride is reacted with the hydroxyl groups in the graft chain;

ⓓ the method in which an acid anhydride is reacted with the hydroxyl group in the graft chain, followed by the reaction with glycidyl(meth)acrylate;

ⓔ the method in which the hydroxyl group in the graft chain is condensed with the condensing crosslinkable monomer as exemplified in (f), thereby leaving (meth)acrylamide group in the side chain;

ⓕ the method in which the hydroxyl group in the graft chain is reacted with glycidyl(meth)acrylate; etc.

When the graft chains in the graft copolymer of the present invention are heat-crosslinkable, it is preferable to effect heating after formation of a pattern by irradiation of an active energy ray. On the other hand, also in the case where the above graft chains are photopolymerizable, there is no problem in performing heating within the range permissible in aspect of heat resistance of the support, but rather more preferable results can be given.

The graft chains may be also graft chains comprising various hydrophobic monomers, etc., as the copolymer component within the range from 0 to about 25 wt. % for exhibiting various functions other than those derived only from hydrophilic monomers as exemplified above in (a)–(f). The graft copolymers to be used in the present invention may be classified broadly into those having no curability, those which are photocrosslinkable and those which are heat crosslinkable, but all of them enable precise patterning by imparting to the composition form retentivity in the curing step of the composition of the present invention (namely curing by active energy ray irradiation and optional thermal curing), and also provide excellent adhesiveness, chemical resistance and high mechanical strength to the pattern obtained by curing.

The above graft copolymer to be used in the composition of the present invention can be produced according to known methods, specifically various methods as described in, for example, "Polymer Alloy, Base and Application" p. 10–35 (edited by Kobunshi Gakkai, published by Tokyo Kagaku Dojin K. K., 1981). Examples of such methods may include (1) the chain transfer method, (2) the method by use of radiation, (3) the oxidative polymerization method, (4) the ion graft polymerization method, and (5) macromonomer method.

The graft copolymer to be used in the present invention can give more remarkable surfactant effect as the lengths of the graft chains are more regular, and therefore it is preferable to use the method of (4) or (5), particularly preferably the macromonomer method of (5) which is advantageous in designing of material. The weight average molecular weight of the graft copolymer may be preferably within the range of from about 5000 to 300000, and when used as a dry film, preferably within the range of from about 30000 to 300000. The monomer (II) having an ethylenically unsaturated bond to be used as another component in the composition of the present invention is a component for permitting the composition of the present invention to exhibit curability with an active energy ray, preferably having a boiling point of 100° C. or higher under atmospheric pressure, also having two or more ethylenically unsaturated bonds, and various known monomers curable by irradiation of an active energy ray can be used.

Specific examples of such monomers having two or more ethylenically unsaturated bonds include (i) (meth)acrylic acid esters of polyfunctional epoxy resins having two or more epoxy groups in one molecule, (ii) (meth)acrylic acid esters of alkyleneoxide addition products of polyhydric alcohols, (iii) polyester (meth)acrylates having (meth)acrylic acid ester group at the terminal ends of the molecular chains of polyesters having molecular weights of 500 to 3000 comprising dibasic acid and dihydric alcohol, (iv) the reaction products between polyisocyanates and (meth)acrylic acid monomers having hydroxyl groups. The above monomers (i)–(iv) may be urethanemodified products having urethane bonds in the molecules.

Examples of the monomers belonging to (i) include (meth)acrylic acid esters of epoxy resins as represented by the bisphenol A type, bisphenol S type, bisphenol F type, novolac type, alicyclic type, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula III:

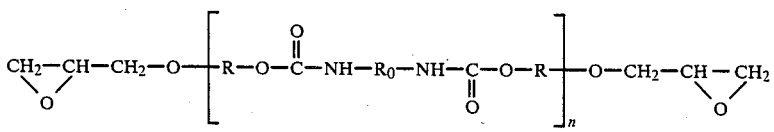

(wherein R represents an alkyl group or an oxyalkyl group, R₀ represents:

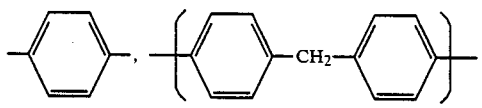

or an alkyl gruop).

Examples of the monomers belonging to (ii) include ethyleneglycol di(meth)acrylate, diethyleneglycol (meth)acrylate, polyethyleneglycol di(meth)acrylate, 1,6-hexanediol (meth)acrylate, polyethleneglycol di(meth)acrylate, pentaerythritol tri(meth)acrylate and the like, and those known under the trade names of KAYA-RAD HX-220, HX-620, D-310, D-320, D-330, DPHA, R-604, DPCA-20, DPCA-30, DPCA-60, DPCA-120 (all produced by Nippon Kayaku K. K.), and also those known under the trade names of NK ester BPE-200, BPE-500, BPE-1300, A-BPE-4 (all produced by shin Nakamura Kagaku K. K.), etc., may also be available.

The monomers belonging to (iii) may be exemplified by those known under the trade names of Aronix M-6100, M-6200, M-6250, M-6300, M-6400, M-7100, M-8030, M-8060, M-8100 (all produced by Toa Gosei Kagaku K. K.). Examples of the monomers belonging to (ii) and having urethane bonds of polyester include those known under the trade names of Aronix M-1100, Aronix M-1200, (both produced by Toa Gosei Kagaku K. K.).

The monomers belonging to (iv) may include the reaction products between polyisocyanate such as tolylene diisocyanate, isophorone diisocyanate, hexamethylene diisocyanate, trimethylhexanethylene dissocyanate, lysine diisocyanate, diphenylmethane diisocyanate or the like with a hydroxyl containing (metha)acrylic monomer, and it is possible to use the reaction products having (meth) acrylic acid esters containing hydroxyl gruop(s) added to polyisocyanate compounds known under the trade names of Sumidule N (buret derivative of hexanethylene diisocyanate), Sumidule L (trimethylolpropane modified product of tolylene diisocyanate) (all produced by Sumitomo Bayer Urethane K. K.), etc. The hydroxyl containing (meth)acrylic monomer as herein mentioned may preferably include hydroxyethyl (meth)acrylate and hydroxypropyl (meth)acrylate. It is also possible to use other (meth)acrylic monomers containing hydroxyl gruop(s) previously mentioned for the graft chain of the graft copolymer in the present specification.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may included, for example, carboxyl containing unsaturated monomers such as (meth)acrylic acid or the like; glycidyl containing unsaturated monomers such as glycidyl (meth)acrylate or the like; $C_2$–$C_8$ hydroxy-alkyl esters of (meth)acrylic acid such as, hydroxyethyl (meth)acrylate, hydroxypropyl (meth)acrylate or the like; monoesters of (meth)acrylic acid with polyethyleneglycol or polypropyleneglycol such as polyethlene-glycol mon(meth)acrylate, polypropyleneglycol mono(meth)acrylate or the like; $C_1$–$C_{12}$ alkyl or cycloalkyl esters of (meth)acrylic acid such as methyl(meth)acrylate, ethyl(meth)acrylate, propyl (meth)acrylate, isopropyl (meth)acrylate, butyl(meth)acrylate, hexyl (meth)acrylate, octyl (meth)acrylate, lauryl (meth)acrylate, cyclohexyl (meth)acrylate or the like; other monomers such as styrene vinyltoluene, methylstyrene, vinyl acetate, vinyl isobutyl ether, acrylonitrile, (meth)acrylamide, (meth)acrylic acid adduct of alkylglycidyl ether, vinylpyrrolidone, dicyclopentenyloxyethyl (meth)acrylate, ε-caploractone-modified bydroxyalkyl (meth)acrylate, tetrahydrofurfuryl (meth)acrylate, phenoxyethyl (meth)acrylate: and others.

Anyway, by use of the above monomer having ethylenically unsaturated bonds, curability to an active energy ray can be imparted to the composition of the present invention.

The active energy ray to be used for curing of the active energy ray-curable resin composition of the present invention may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

The active energy ray-curable resin composition of the present invention can be cured by the active energy ray as described above, and it is preferable to add thereto a photopolymerization initiator when employing an active energy ray with wavelength of 250 nm to 450 nm. As the photopolymerization initiator, known substances can be used without any particular limitation.

Specific examples of such photopolymerization initiators include dibenzoyl and its derivatives benzoin alkyl ethers such as benzoin isobutyl ether, benzoin isopropyl ether, benzoin-n-butyl ether, benzoin ethyl ether, benzoin methylether and the like; benzophenones such as benzophenone, 4, 4'-bis(N, N-diethylamino)benzophenone, benzophenone methyl ether and the like; anthraquinones such as 2-ethylanthraquinone, 2-t-butylanthraquinone and the like; xanthones such as 2,4-dimethylthioxanthone, 2,4-diisopropylthioxanthone and the like; acetophenones such as 2,2-dimethoxy-2-phenylacetophenone, α, α-dichloro-4-phenoxyacetophenone, p-tert-butyltrichloroacetophenone, p-tert-butyl-dichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl) -2-hydroxy-2-methylpropane-1-one (e.g. Darocure 1116, produced by MERCK Co.), 2-hydroxy-2-methyl -1-phenylpropane-1-one (Darocure 1173, produced by MERCK CO.); etc., as preferable ones. In addition to these photopolymerication initiators, amino compounds may be added as the photopolymerization accelerator.

The amino compounds to be used as the photopolymerization accelerator may include ethanolamine ethyl-4-dimethylaminobenzoate, 2-(dimethylamino)-ethylbenzoate, p-dimethylaminobenzoic acid n-amylester, p-dimethylaminobenzoic acid isoamylester, etc.

The constitutional ratio of the above materials constituting the active energy ray-curable resin composition of the present invention may be made 20 to 80 parts by weight preferably 20 to 50 parts by weight for the graft copolymer and 80 to 20 parts by weight preferably 50 to 80 parts by weight for the monomer having ehylenically unsaturated bonds.

When a photopolymerization initiator is used in the resin composition of the present invention, the photopolymerization initiator may be used in an amount within the range from 0.1 to 20 parts by weight, preferably from 1 to 10 parts by weight based on 100 parts by weight of the resin components comprising the graft copolymer and the monomer having ethylencially unsaturated bonds.

As the solvent to be used when employing the active energy ray-curing resin composition of the present invention in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the composition of the present invention.

The active energy ray-curable resin composition of the present invention may further contain in addition to the above photopolymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil-soluble dyes and pigments within the range which do not substantially prevent transmission the active energy ray. As the filter, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used in the composition of the present invention.

The active energy ray-curable resin composition of the present invention can be used for protective coating of glass, adhesive, insulating layer of liquid crystal display devices or surface modification such as transparent coloration or opaque coloration on glass plate, imparting of water proofness, water repellency, anti-stain property, etc. Also, by making available of excellent chemical resistance, it is useful as the masking material for glass etching or metallizing such as electroless copper plating, etc., solder mask for printing-wiring board, etc. It is also useful for formation of minute liquid pathways, cooling pathways utilizing water resistance, or particularly for formation of fluid logical elements. Further, it can be utilized as a photo-sensitive liquid or dry film for screen process printing which can be used for both aqueous and oily liquid.

When the active energy ray-cutting resin composition of the present invention is provided for various uses as mentioned above, it can be used according to the methods as exemplified below.

(1) The composition of the present invention is applied on a substrate to a desired thickness within the range from 1 μm to 100 μ, the solvent is dried by evaporation and then an active energy ray is irradiated. Then, the substrate is optionally heated at 100° C. or higher for about 5 minutes to 60 minutes in such a case where a heat-curable graft copolymer is used.

(2) The composition of the present invention is applied on a substrate to a desired thickness of 1 to 100 μm. Subsequently, a mask pattern with a transmittance of the active energy ray of at least 1% or less is closely contacted on the composition, and an active energy ray is irradiated from above the mask. Then, development is effected with a developer dissolving the composition to remove the non-irradiated portion. Then, the substrate is optionally heated at a temperature of at least 100° C. for about 5 to 60 minutes.

The cured film obtained as described above is excellent in resolution as a matter of course, and also in adhesion to the substrate, mechanical strength, water resistance and chemical resistance.

The present invention is described in more detail by referring to the following Examples. In the following description, parts and % are based on weight unless otherwise specifically noted.

EXAMPLE 1

By use of 80 parts of 2-hydroxyethyl methacrylate and 20 parts of t-butyl acrylate, radical chain transfer polymerization was carried out with the use of thioglycolic acid as the chain transfer agent and azobisisobutyronitrile as the initiator to obtain an oligomer having carboxylic groups at the terminal ends. By allowing glycidyl methacrylate to react with this oligomer, a macromonomer was obtained having methacryloyl group at one terminal end of the molecular chain. The macromonomer was found to have a weight average molecular weight of 2000 according to the GPC method. Solution polymerization of 30 parts of the macromonomer, 50 parts of methyl methacrylate and 20 parts of isobornyl acrylate in methylcellosolve gave a thermoplastic graft copolymer having a weight average molecular weight of 60000 (this is called GP-1).

By use of the GP-1, an active energy ray-curable resin composition of the present invention with the following composition was prepared.

| | |
|---|---|
| GP-1 | 100 parts |
| Trimethylolpropane triacrylate | 60 parts |
| Epoxyester 3002 M*1 | 140 parts |
| Benzophenone | 10 parts |
| Michler's ketone | 5 parts |
| Crystal violet | 0.3 parts |
| Methylcellosolve | 350 parts |

*1Methacrylate of epoxy resin produced by Kyoeisha Yushi Kagaku Kogyo K.K.

The composition was applied by a bar coater on a 10 cm × 10 cm Pyrex substrate which had been subjected to sonication cleaning treatment in a washing liquid Difron (produced by Daikin Kogyo K. K.) to a thickness of about 50 μm after drying. On the surface of this composition was laminated a polyethyleneterephthalate film (Lumilar T type) with a thickness of 16 μm. Then, by use of a mask for resolution test, exposure was effected by means of an exposure light source for semiconductor "Mask Alignment Device MA-10" (produced by Mikasa K. K.) using an ultra-high pressure mercury lamp with the center wavelength in the vicinity of 365 nm and a light energy of 12 mW/cm$^2$ at the irradiated surface for 20 seconds. After exposure, development was practiced in the sonication cleaning machine with the use of 1, 1, 1-trichloroethane for 45 seconds. The resolution of the resin composition after development was found to reproduce accurately the line-/interval patterns with 50 μm widths.

Next, the substrate was dried by heating and post exposure of 10 J/cm$^2$ was practiced. For the substrate, the cross-cut tape was practiced. For the substrate, the cross-cut tape peel-off test was practiced with the use of cellophane tape for industrial use. As a result, 100/100 adhesiveness was exhibited, with complete adhesion except for the clear scars of the crosscuts.

Also, this substrate was immersed in an aqueous NaOH solution of pH =0.9 to practice pressure cooker test under the conditions of 121° C., 2 atm and 10 hours. After the pressure cooler test, the cross-cut tape peeling test and the peeling test at the portion with the 50 μm pattern were again practiced. In each test, no lowering in adhesiveness such as peel-off, rise, etc., was observed. Also, no denaturation such as whitening of the coated film was recognized at all.

EXAMPLE 2

By use of 30 parts of N-methylolmethacrylamide and 70 parts of 2-hydroxyethyl methacrylate, radical chain transfer polymerization was carried out with the use of thioglycolic acid as the chain transfer agent and azobisisobutyronitrile as the initiator to obtain an oligomer having terminal carboxylic groups. By allowing glycidyl methacrylate to react with this oligomer, a macromonomer was obtained having methacryloyl group at one terminal end of the molecular chain. This macromonomer was found to have a weight average molecular weight of 1500 according to the GPC method.

Solution polymerization of 30 parts of the macromonomer, 50 parts of methyl methacrylate and 20 parts of isobornyl methacrylate in methylcellosolve gave a graft copolymer having heat-crosslinkability with a weight average molecular weight of 65000 (this is called GP-2). By use of this GP-2, an active energy ray-curable resin composition of the present invention with the following composition was prepared.

| | |
|---|---|
| GP-2 | 100 parts |
| Neopentyl glycol diacrylate | 60 parts |
| Epoxyester 3002 M | 140 parts |
| Benzophenone | 10 parts |
| Michler's ketone | 5 parts |
| Crystal violet | 0.3 parts |
| Methylcellosolve | 350 parts |

By use of this composition, a pattern of lines and intervals of 50 μm with a film thickness of 40 μm was formed on a 10 cm × 10 cm Pyrex substrate in the same manner as in Example 1. After driving by evaporation of the developer, post-exposure was practiced with the use of the same light source for 10 minutes. Subsequently, heat treatment was practiced at 150° C. for 15 minutes.

The substrate having the cured pattern thus formed was immersed in an aqueous NaOH solution of pH =9.0 to practice pressure cooker test of 121° C., 2 atm and 20 hours. After completion of the test, the substrate was washed with water and dried, and then the cross-cut tape peeling test and the peeling test at the pattern portion were practiced. As the results, the adhesiveness was 100/100 and there was no peel-off at the pattern portion.

EXAMPLE 3

In the same manner as in Example 1 and Example 2, according to the radical chain transfer polymerization method, by use of 90 parts of 3-chloro-2-hydroxypropyl methacrylate and 10 parts of N-vinylpyrrolidone, a macromonomer (poly-3-chloro-2-hydroxypropyl methacrylate/ N-vinylpyrrolidone) was obtained having vinyl group at one terminal end of the molecular chain and having a weight average molecular weight of about 2500. Copolymerization of 25 parts of the macromonomer, 20 parts of isobornyl methacrylate, 45 parts of methyl methacrylate and 10 parts of dimethyl-aminoethyl methacrylate was conducted in methyl isobutyl ketone (weight average molecular weight 65000).

Next, into the polymer solution in which 100 parts of the copolymer was dissolved, 11 parts of a partial urethane compound obtained by reacting hexamethylenediisocyanate with 2-hydroxyethyl methacrylate to NCO equivalent: OH equivalent =2.0 : 1.1 was added to carry out the reaction, thereby effecting acrylurethanization of 30% of the 3-chloro-2-hydroxypropyl methacrylate component, to obtain a graft copolymer having photopolymerizable acryl ester groups in the graft chains (this is called GP-3).

By use of the GP-3, an active energy ray-curable resin composition with the following compositions was prepared.

| | |
|---|---|
| GP-3 | 100 parts |
| Trimethylolpropane triacrylate | 30 parts |
| NK ester EPM 800*[2] | 100 parts |
| Irgacure 651 | 11 parts |
| Crystal violet | 0.2 parts |
| Methyl isobutyl ketone | 300 parts |

*[2]Epoxy resin methacrylic acid ester produced by Shin Nakamura Kagaku K.K.

On a silicon wafer having an oxide film $SiO_2$ formed on the surface, this composition was applied by a bar coater to a thickness after drying of 50 $\mu$m. Next, a pattern for resolution test was formed in the same manner as in Example 1. The pattern formed was found to reproduce accurately a line/interval pattern with a width of 50 $\mu$m. Next, this silicon wafer was dried by heating and post-exposure of 10 $J/cm^2$ was practiced by use of the same UV-ray light source as used for the pattern exposure.

When the cross-cut tape peeling test was practiced for this silicon wafer, no peel-off of the coated film was recognized at all.

Next, this silicon wafer was immersed in an aqueous NaOh solution of pH =9.0 to practice pressure cooker test of 121° C., 2 atm and 20 hours. After completion of the test, the cross-cut tape peeling test and the peeling test at the pattern portion were again practiced. In each test, no lowering in adhesiveness such as peel-off, rise, etc., was observed.

EXAMPLE 4

In the same manner as in Example 1 and Example 2, according to the radical chain transfer polymerization method, 70 parts of butoxymethylacrylamide was allowed to react with 30 parts of 2-hydroxyethyl methacrylate to obtain a macromonomer (poly-butoxymethylacrylamide/ 2-hydroxyethyl methacrylate) having vinyl group at one terminal end of the molecular chain and having a weight average molecular weight of about 3000.

Polymerization of 25 parts of the macromonomer, 55 parts of methyl methacrylate, 15 parts of isobornyl methacrylate and 5 parts of acrylonitrile in methylcellosolve gave a graft copolymer having heat crosslinkability and a weight average molecular weight of 65000 (this is called GP-4).

By use of the GP-4, an active energy ray-curable resin composition with the following composition was prepared.

| | |
|---|---|
| GP-4 | 100 parts |
| Trimethylolpropane triglycidyl ether acrylic acid ester | 100 parts |
| Urethane acrylate 11R4003*[3] | 100 parts |
| Copper phthalocyanine | 15 parts |
| Paratoluene sulfonic acid | 3 parts |
| Irgacure 651 | 15 parts |
| Methylcellosolve | 300 parts |

*[3]urethane acrylate produced by Nagase Kasei K.K.

A 10 cm $\times$ 10 cm Pyrex glass substrate was coated by a spinner with a 1% ethanol solution of a silane coupling agent having thiol groups $\gamma$-mercaptopropyltrimethoxysilane. Coating was carried out by rotating at 2500 rpm for 25 seconds. Next, the glass plate was subjected to heat treatment at 120° C. for 10 minutes.

The mill dispersion of the above resin composition was applied by a wire bar on a 16 $\mu$m polyethylene terephthalate film and dried at 100° C. for 20 minutes to form a resin composition layer with a film thickness of 10 $\mu$m. Next, this film was laminated on the above Pyrex glass plate by means of a laminator HRL-24 (trade name, produced by Du Pont Co.) at 120° C., at a circumferential speed of 1 m/min or lower.

Subsequently, in the same manner as in Example 1, a sharp pattern colored in blue with lines and intervals of 25 $\mu$m could be formed. Next, post exposure of 10 $J/cm^2$ and heat treatment of 150° C. and 15 minutes were applied to effect complete curing.

The pattern formed was provided for pressure cooker test under the same conditions as in Example 1 to examine adhesiveness. In the cross-cut tape peeling test after the pressure cooker test, no peel-off of the coated film was observed at all.

COMPARATIVE EXAMPLE

Methyl methacrylate, 2-hydroxyethyl methacrylate and butyl acrylate (=60/30/10 molar ratio) were polymerized in methyl isobutyl ketone to obtain a thermoplastic linear polymer compound with a weight average molecular weight of 88000 (this is called LP-1).

In entirely the same manner as in Example 1, except for using LP-1, an active energy ray-curable resin composition was prepared and pattern formation was effected.

The pattern obtained was found to have substantially the same resolving power as in Example 1. However, in the pressure cooker test, peel-off of the pattern from the substrate occurred before initiation of the peeling test, thus indicating low water resistance and adhesiveness.

As can be clearly seen from Examples and Comparative example as described above, it can be appreciated that the active energy ray-curable resin composition of the present invention is capable of forming a pattern with a high resolving power and at the same time has high adhesiveness to a support, and further has high heat resistance, mechanical strength and chemical resistance.

The active energy ray-curable resin composition of the present invention has excellent sensitivity and resolving power as the pattern forming material, and can form a pattern of high resolving power at high density. Besides, the pattern formed is excellent in adhesiveness, mechanical strength and chemical resistance when viewed as a coating material, and therefore it can be used as protective coating or structural member for which durability over a long term is demanded.

Also, when a graft copolymer having curability is used, it is possible to obtain an active energy ray-curable resin composition which is particularly excellent in the above mentioned adhesiveness, mechanical strength and chemical resistance.

We claim:

1. An active energy ray-curable resin composition comprising: (A) a graft copolymerized polymer comprising graft chains composed mainly of structural units derived from at least one monomer selected from the group consisting of (a) hydroxyl containing (meth)acrylic monomers, (b) amino or alkylamino containing (meth)acrylic monomers, (c) carboxyl containing (meth)acrylic or vinyl monomers, (d) N-vinylpyrrolidone, (e) vinylpyridine or its derivatives and (f) (meth)acrylic amide derivatives represented by the general formula (II) shown below:

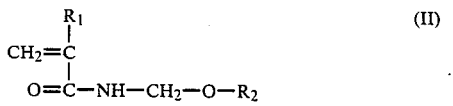

wherein $R_1$ is hydrogen or methyl group and $R_2$ is hydrogen or an alkyl or acryl group having 1 to 4 carbon atoms which may have a hydroxyl group, added to trunk chains comprising both structural units formed from at least one monomer represented by the general formula (I) shown below:

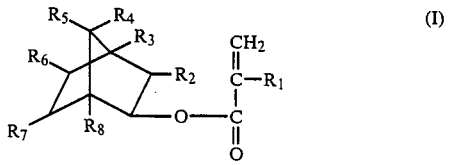

wherein $R_1$ to $R_8$ each represent hydrogen or methyl group, and structural units formed from at least one monomer selected from the group consisting of alkyl (meth)acrylates, acrylonitrile and styrene, and (B) a monomer having an ethylenically unsaturated bond.

2. An active energy ray-curable resin composition according to claim 1, containing 20 to 80 parts by weight of the graft copolymerized polymer (A) and 80 to 20 parts by weight of the monomer having an ethylenically unsaturated bond (B).

3. An active energy ray-curable resin composition according to claim 1, wherein the proportion of the monomer represented by the formula (I) formulated in the graft copolymerized polymer (A) is within the range of from 1 to 30% by weight.

4. An active energy ray-curable resin composition according to claim 1, wherein said monomer having an ethylenically unsaturated bond has a boiling point of 100° C. or higher under the atmospheric pressure and at least two ethylenically unsaturated bonds.

5. An active energy ray-curable resin composition according to claim 1, wherein said monomer having an ethylenically unsaturated bond is selected from the group consisting of (i) (meth)acrylic acid esters of polyfunctional epoxy resins having two or more epoxy groups in one molecule; (ii) (meth)acrylic acid esters of alkyleneoxide addition products of polyhydric alcohols; (iii) polyester (meth)acrylates having (meth)acrylic acid ester group at the terminal ends of the molecular chains of polyesters having molecular weights of 500 3000 comprising dibasic acid and dihydric alcohol; and (iv) the reaction products between polyisocyanates and (meth)acrylic acid monomers having hydroxyl groups.

6. An active energy ray-curable resin composition according to claim 4, further containing a monomer having only one ethylenically unsaturated bond.

7. An active energy ray-curable resin composition according to claim 1, further comprising a monomer which is subjected to ring opening by heat to be crosslinked.

8. An active energy ray-curable resin composition according to claim 7, wherein the monomer is glycidyl (meth)acrylate.

9. An active energy ray-curable resin composition according to claim 1, wherein a photopolymerizable monomer is added to some of the graft chains of said graft copolymerized polymer.

10. An active energy ray-curable resin composition according to claim 1, wherein a hydrophobic monomer is contained within the range of 0 to about 25% by weight as a component of comonomers in said graft copolymerized polymer.

11. An active energy ray-curable resin composition according to claim 1, further comprising a photopolymerization initiator.

12. An active energy ray-curable resin composition according to claim 1, further comprising 0.1 to 20 parts by weight of a photopolymerization initiator based on 100 parts by weight of the total amount of the graft copolymerized polymer (A) and the monomer having an ethylenically unsaturated bond (B).

13. An active energy ray-curable resin composition according to claim 11, wherein the photopolymerization initiator is a compound selected from the group consisting of dibenzoyl, benzoin alkyl ethers, benzophenones, anthraquinones, xanthones and acetophenones.

14. An active energy ray-curable resin composition according to claim 11, further comprising a photopolymerization accelerator.

15. An active energy ray-curable resin composition according to claim 14, wherein the photopolymerization accelerator is an amino compound.

16. An active energy ray-curable resin composition according to claim 1, further comprising an additive selected from the group consisting of catalysts for condensation cross-linking, heat polymerization inhibitors, colorants, fine particulate fillers, adhesion promotors, and plasticizers.

17. An active energy ray-curable resin composition according to claim 16, wherein the catalyst for condensation cross-linking is selected from the group consisting of sulfonic acids and carboxylic acids.

18. An active energy ray-curable resin composition according to claim 16, wherein the heat polymerization inhibitor is selected from the group consisting of hydroquinone and its derivatives, p-ethoxyphenol and phenothiazine.

19. An active energy ray-curable resin composition according to claim 16, wherein the colorant if selected from the group consisting of oil-soluble dyes and pigments.

20. An active energy ray-curable resin composition according to claim 16, wherein the fine particulate filler is selected from the group consisting of extender pigments and fine plastic particles.

21. An active energy ray-curable resin composition according to claim 16, wherein the adhesion promotor is selected from the group consisting of silane coupling agents and low molecular surfactants.

22. An active energy ray-curable resin composition according to claim 1, wherein said graft copolymer has a weight-average molecular weight of about 5000 to 300,000.

* * * * *